(12) United States Patent
Goto et al.

(10) Patent No.: US 10,538,862 B2
(45) Date of Patent: Jan. 21, 2020

(54) CRYSTAL LAMINATE STRUCTURE

(71) Applicants: TAMURA CORPORATION, Tokyo (JP); NATIONAL UNIVERSITY CORPORATION TOKYO UNIVERSITY OF AGRICULTURE AND TECHNOLOGY, Tokyo (JP)

(72) Inventors: Ken Goto, Tokyo (JP); Akinori Koukitu, Tokyo (JP); Yoshinao Kumagai, Tokyo (JP); Hisashi Murakami, Tokyo (JP)

(73) Assignees: TAMURA CORPORATION, Tokyo (JP); NATIONAL UNIVERSITY CORPORATION TOKYO UNIVERSITY OF AGRICULTURE AND TECHNOLOGY, Tokyo (JP)

( * ) Notice: Subject to any disclaimer, the term of this patent is extended or adjusted under 35 U.S.C. 154(b) by 36 days.

(21) Appl. No.: 15/559,167

(22) PCT Filed: Feb. 17, 2016

(86) PCT No.: PCT/JP2016/054620
§ 371 (c)(1),
(2) Date: Sep. 18, 2017

(87) PCT Pub. No.: WO2016/152335
PCT Pub. Date: Sep. 29, 2016

(65) Prior Publication Data
US 2018/0073164 A1 Mar. 15, 2018

(30) Foreign Application Priority Data
Mar. 20, 2015 (JP) .................. 2015-058518

(51) Int. Cl.
*C30B 29/16* (2006.01)
*C30B 25/20* (2006.01)
(Continued)

(52) U.S. Cl.
CPC .............. *C30B 29/16* (2013.01); *C30B 25/02* (2013.01); *C30B 25/20* (2013.01); *C30B 29/26* (2013.01);
(Continued)

(58) Field of Classification Search
CPC ..... C30B 25/02; C30B 29/26; H01L 21/2053; H01L 21/02598; H01L 21/02576; H01L 21/02433; H01L 29/045
See application file for complete search history.

(56) References Cited

U.S. PATENT DOCUMENTS

| 8,421,190 B2 | 4/2013 | Okahisa et al. |
| 8,822,263 B2 | 9/2014 | Koukitu et al. |

(Continued)

FOREIGN PATENT DOCUMENTS

| CN | 103765593 A | 4/2014 |
| CN | 103782392 A | 5/2014 |

(Continued)

OTHER PUBLICATIONS

Sharon Ann Holgate, Understanding Solid State Physics, p. 253 (Year: 2010).*

(Continued)

*Primary Examiner* — Betelhem Shewareged
(74) *Attorney, Agent, or Firm* — Scully Scott Murphy and Presser

(57) ABSTRACT

A crystal laminate structure includes a $Ga_2O_3$-based substrate, and a $\beta$-$Ga_2O_3$-based single crystal film formed by epitaxial crystal growth on a principal surface of the $Ga_2O_3$-based substrate. The $\beta$-$Ga_2O_3$-based single crystal film includes Cl and a dopant doped in parallel with the crystal growth at a concentration of not less than $1\times10^{13}$ atoms/cm$^3$ and not more than $5.0\times10^{20}$ atoms/cm$^3$.

14 Claims, 9 Drawing Sheets

(51) Int. Cl.
- *H01L 21/205* (2006.01)
- *H01L 21/02* (2006.01)
- *H01L 21/04* (2006.01)
- *C30B 29/26* (2006.01)
- *C30B 25/02* (2006.01)
- *C30B 29/68* (2006.01)
- *C30B 31/08* (2006.01)

(52) U.S. Cl.
CPC ............ *C30B 29/68* (2013.01); *C30B 31/08* (2013.01); *H01L 21/02433* (2013.01); *H01L 21/02576* (2013.01); *H01L 21/02598* (2013.01); *H01L 21/045* (2013.01); *H01L 21/2053* (2013.01)

(56) References Cited

U.S. PATENT DOCUMENTS

| | | | |
|---|---|---|---|
| 9,437,689 | B2 | 9/2016 | Sasaki et al. |
| 9,461,124 | B2 | 10/2016 | Sasaki et al. |
| 10,249,767 | B2 | 4/2019 | Sasaki et al. |
| 2003/0186475 | A1* | 10/2003 | Ueda ............ H01L 21/76251 438/22 |
| 2007/0012943 | A1 | 1/2007 | Okahisa et al. |
| 2009/0127664 | A1 | 5/2009 | Okahisa et al. |
| 2010/0006836 | A1 | 1/2010 | Koukitu et al. |
| 2011/0018003 | A1 | 1/2011 | Okahisa et al. |
| 2014/0217405 | A1 | 8/2014 | Sasaki et al. |
| 2014/0217469 | A1 | 8/2014 | Sasaki et al. |
| 2014/0217554 | A1 | 8/2014 | Sasaki |
| 2016/0265137 | A1 | 9/2016 | Goto et al. |
| 2016/0300953 | A1 | 10/2016 | Sasaki et al. |
| 2016/0365418 | A1 | 12/2016 | Sasaki et al. |
| 2018/0350967 | A1 | 12/2018 | Sasaki et al. |

FOREIGN PATENT DOCUMENTS

| | | |
|---|---|---|
| EP | 2 063 458 A2 | 5/2009 |
| EP | 3 054 037 A1 | 8/2016 |
| JP | 2001-253794 A | 9/2001 |
| JP | 2003-017420 A | 1/2003 |
| JP | 2006-193348 A | 7/2006 |
| JP | 2009-126723 A | 6/2009 |
| JP | 2010-232623 A | 10/2010 |
| JP | 2013-056803 A | 3/2013 |
| JP | 2013-058637 A | 3/2013 |
| JP | 2013-082587 A | 5/2013 |
| WO | WO 2013/035842 A1 | 3/2013 |
| WO | WO 2013/035845 A1 | 3/2013 |

OTHER PUBLICATIONS

Gogova, D. et al., "Structural properties of Si-doped β-Ga2O3 layers grown by MOVPE", Journal of Crystal Growth, vol. 401, Sep. 1, 2014, pp. 665-669.
Extended Supplementary European Search Report dated Oct. 16, 2018 in European Patent Application No. 16 76 8238.4.
Official Action dated Jan. 9, 2018 received from the Japanese Patent Office in related JP 2015-058518 together with English language translation.
International Preliminary Report on Patentability dated Oct. 5, 2017 issued in PCT/JP2016/054620.
International Search Report dated Apr. 12, 2016 issued in PCT/JP2016/054620.
Japanese Office Action dated Jul. 11, 2017 issued in JP 2015-058518.
Murakami, Hisashi et al., "Homoepitaxial growth of Beta-Ga2O3 layers by halide vapor phase epitaxy", Applied Physics Express (Dec. 11, 2014), vol. 8, No. 1, 015503.
Sasaki, Kohei et al., "Device-Quality Beta-Ga2O3 Epitaxial Films Fabricated by Ozone Molecular Beam Epitaxy", Applied Physics Express (Feb. 28, 2012), vol. 5, No. 3, 035502.
Chinese Office Action dated Jul. 18, 2019 in Chinese Patent Application No. 201680016988.8.

* cited by examiner

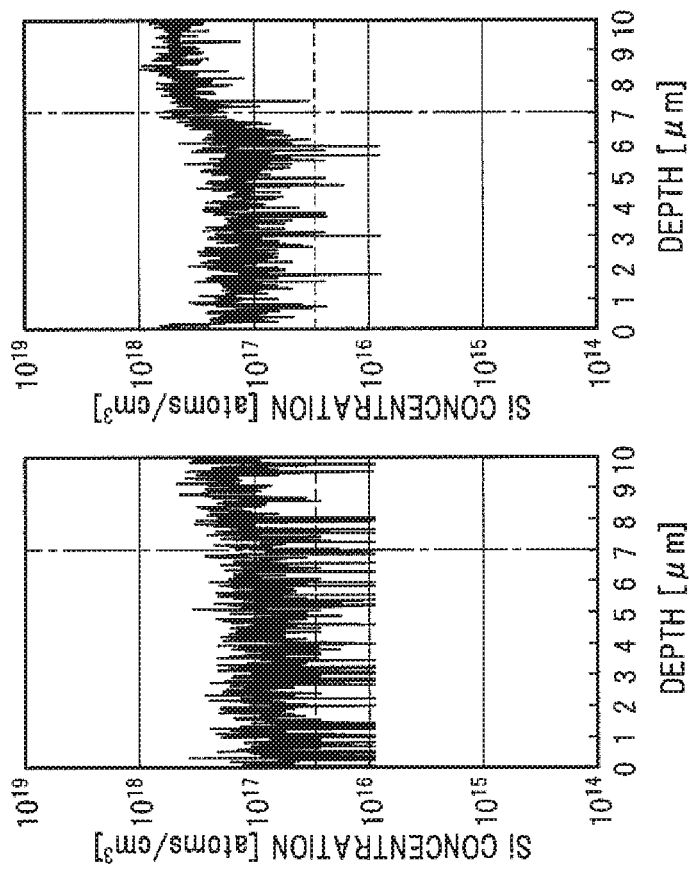

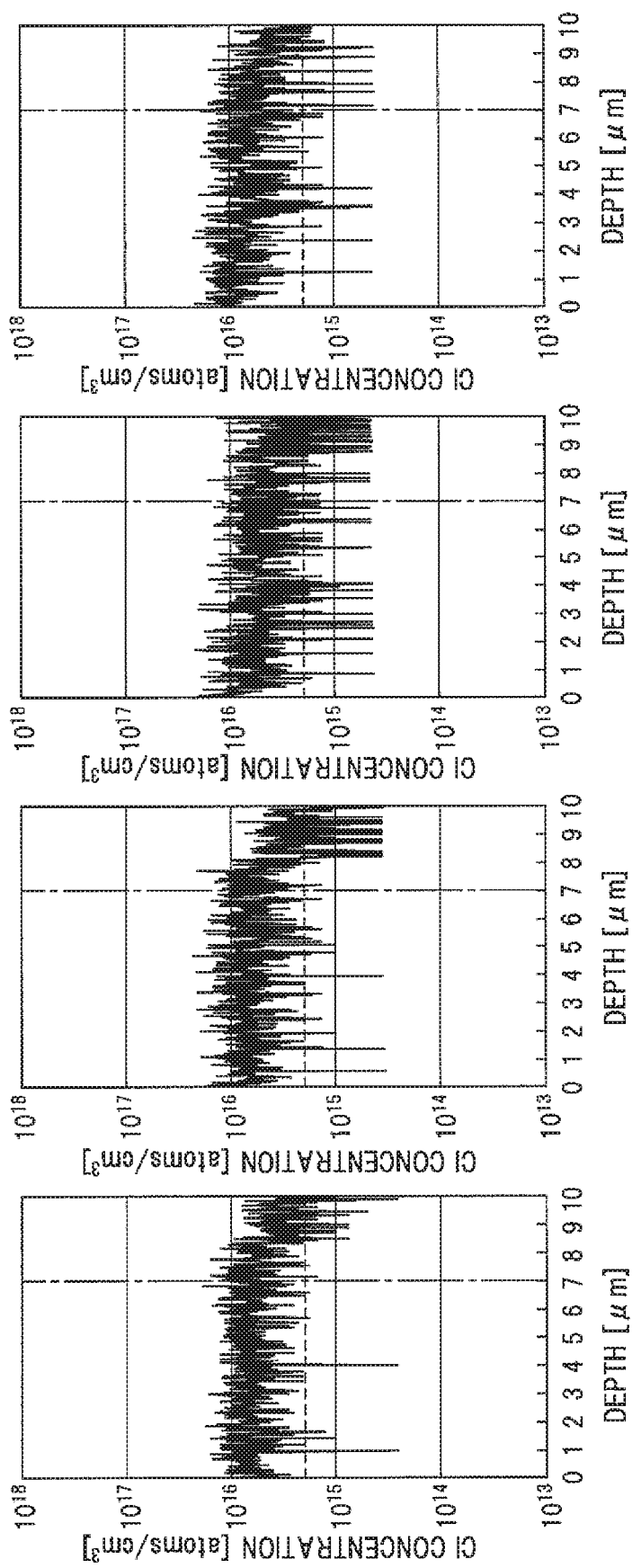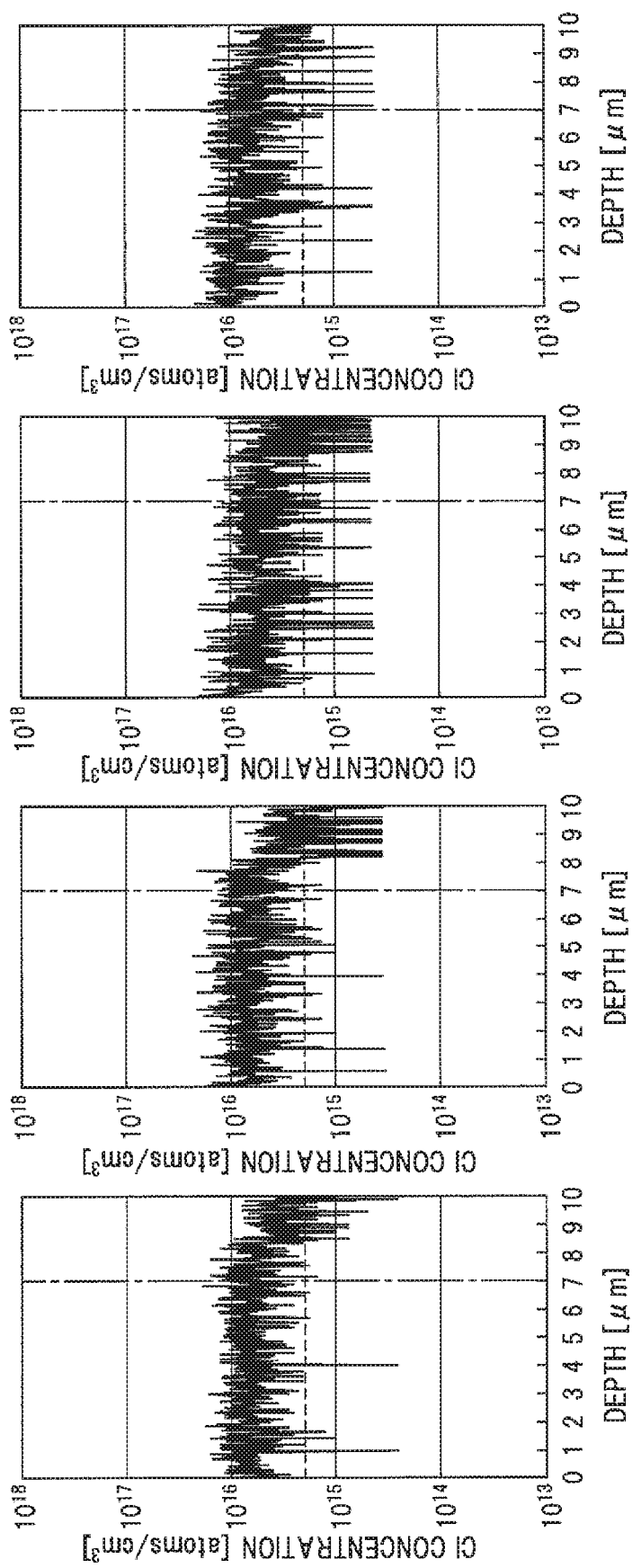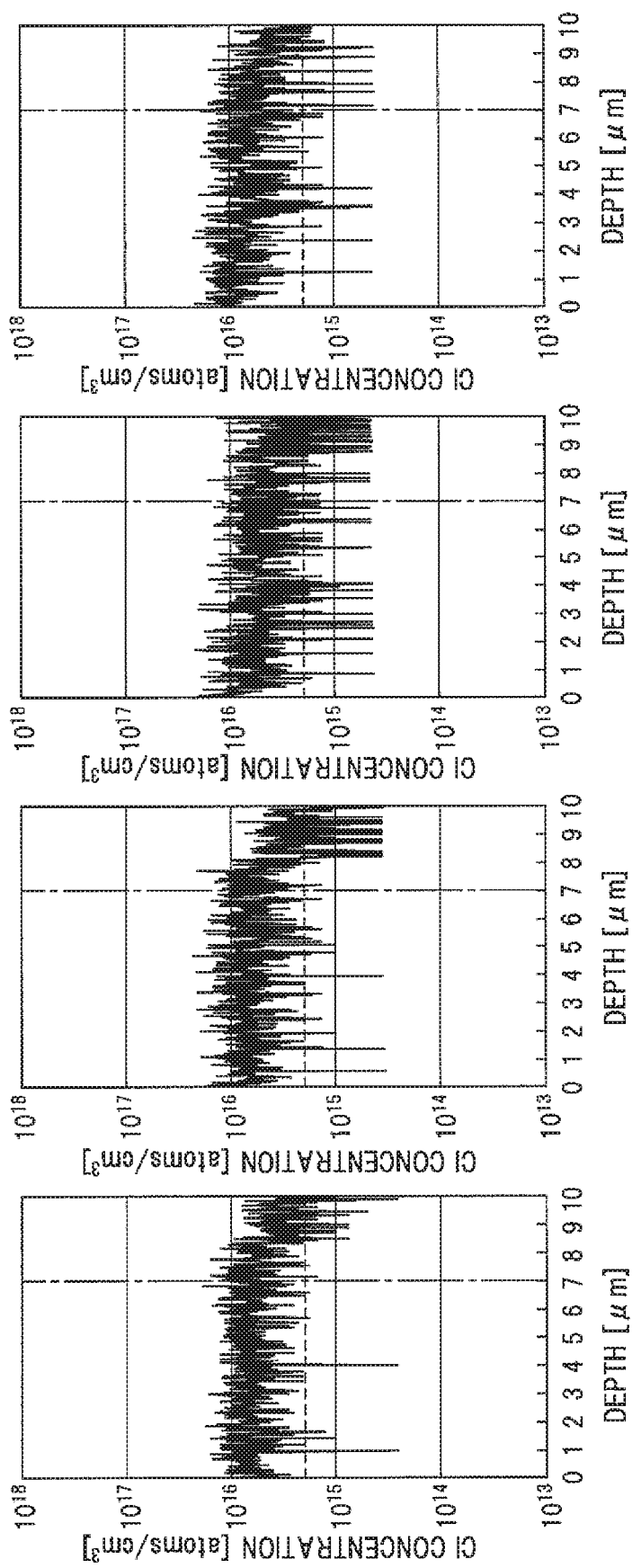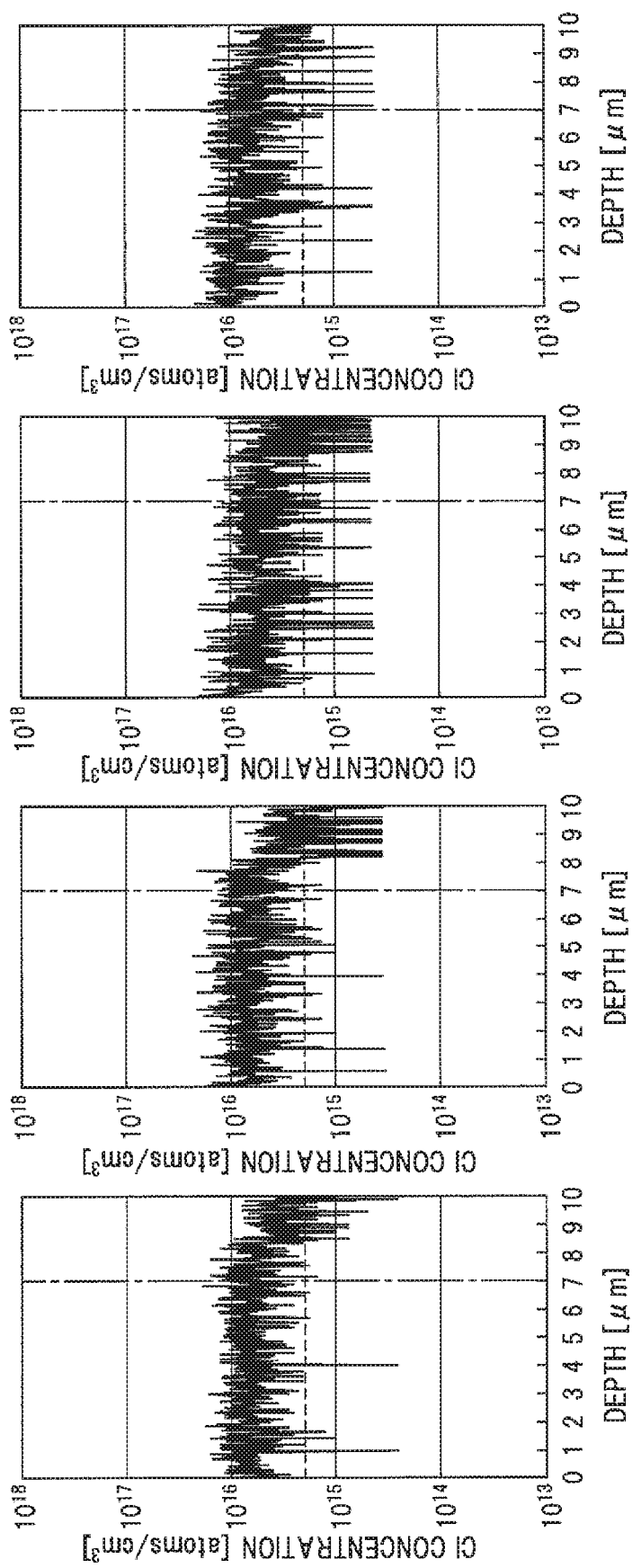

CRYSTAL LAMINATE STRUCTURE

TECHNICAL FIELD

The invention relates to a crystal laminate structure.

BACKGROUND ART

Conventionally, a method in which a dopant is added during crystal growth by the MBE (Molecular Beam Epitaxy) method or the EFG (Edge-defined Film-fed Growth) method (see, e.g., PTLs 1 and 2) and a method in which a dopant is added to a grown $\beta$-Ga$_2$O$_3$-based single crystal by ion implantation (see, e.g., PTL 3) are known to dope a $\beta$-Ga$_2$O$_3$-based single crystal.

CITATION LIST

Patent Literature

[PTL 1]
JP-A-2013-56803
[PTL 2]
JP-A-2013-82587
[PTL 3]
JP-A-2013-58637

SUMMARY OF INVENTION

Technical Problem

When using the MBE method, however, doping with a concentration of not less than $1\times10^{18}$ atoms/cm$^3$ is difficult since impurities segregate during epitaxial crystal growth. In addition, a doping profile in a depth direction and distribution uniformity on the wafer surface are not good due to the impurity segregation and repeatability is poor. Meanwhile, when using the EFG method, since a raw material contains an impurity at a concentration of about $1\times10^{17}$ atoms/cm$^3$, doping with a lower concentration is not possible.

In case of ion implantation, implantation depth of the impurity ion is limited to about 1 μm. In addition, since the ion beam damages the crystal, vacancy/void-type defects are introduced, causing deterioration of crystallinity.

Therefore, it is one of objects of the invention to provide a crystal laminate structure having a $\beta$-Ga$_2$O$_3$-based single crystal film in which a dopant is included throughout the crystal and the concentration of the dopant can be set across a broad range.

Solution to Problem

To achieve the above-mentioned object, an aspect of the invention provides a crystal laminate structure defined by [1] to [10] below.

[1] A crystal laminate structure, comprising: a Ga$_2$O$_3$-based substrate; and a $\beta$-Ga$_2$O$_3$-based single crystal film formed by epitaxial crystal growth on a principal surface of the Ga$_2$O$_3$-based substrate, wherein the $\beta$-Ga$_2$O$_3$-based single crystal film comprises Cl and a dopant doped in parallel with the crystal growth at a concentration of not less than $1\times10^{13}$ atoms/cm$^3$ and not more than $5.0\times10^{20}$ atoms/cm$^3$.

[2] The crystal laminate structure defined by [1], wherein a concentration of Cl of the $\beta$-Ga$_2$O$_3$-based single crystal film is not more than $5\times10^{16}$ atoms/cm$^3$.

[3] The crystal laminate structure defined by [1] or [2], wherein the dopant comprises Si.

[4] The crystal laminate structure defined by [1] or [2], wherein the dopant concentration is not less than $6.5\times10^{15}$ atoms/cm$^3$ and not more than $2.1\times10^{20}$ atoms/cm$^3$.

[5] The crystal laminate structure defined by [1] or [2], wherein a density of a carrier generated by the doping of the dopant is not less than $1\times10^{13}$ cm$^{-3}$ and not more than $5.0\times10^{20}$ cm$^{-3}$.

[6] The crystal laminate structure defined by [5], wherein a density of a carrier generated by the doping of the dopant is not less than $3.2\times10^{15}$ cm$^{-3}$ and not more than $1.8\times10^{18}$ cm$^{-3}$.

[7] The crystal laminate structure defined by [1] or [2], wherein the $\beta$-Ga$_2$O$_3$-based single crystal film comprises a $\beta$-Ga$_2$O$_3$ crystal film.

[8] The crystal laminate structure defined by [1] or [2], wherein the principal surface of the Ga$_2$O$_3$-based substrate has a plane orientation of (001), (010), (−201) or (101).

[9] The crystal laminate structure defined by [3], wherein a source gas of the dopant comprises a SiCl$_4$ gas.

[10] The crystal laminate structure defined by [1] or [2], wherein a thickness of the $\beta$-Ga$_2$O$_3$-based single crystal film is not less than 1000 nm.

Advantageous Effects of Invention

According to the invention, it is possible to provide a crystal laminate structure having a $\beta$-Ga$_2$O$_3$-based single crystal film in which a dopant is included throughout the crystal and the concentration of the dopant can be set across a broad range.

BRIEF DESCRIPTION OF DRAWINGS

FIG. 7A is a SIMS profile of Si in a sample c3 shown in Table 3.

FIG. 7B is a SIMS profile of Si in the sample c4 shown in Table 3.

FIG. 7C is a SIMS profile of Si in a sample c6 shown in Table 3.

FIG. 7D is a SIMS profile of Si in a sample c7 shown in Table 3.

FIG. 8A is a SIMS profile of Cl in the sample c3 shown in Table 3.

FIG. 8B is a SIMS profile of Cl in the sample c4 shown in Table 3.

FIG. 8C is a SIMS profile of Cl in the sample c6 shown in Table 3.

FIG. 8D is a SIMS profile of Cl in the sample c7 shown in Table 3.

DESCRIPTION OF EMBODIMENT

Embodiment (Configuration of Crystal Laminate Structure)

Figure 1:
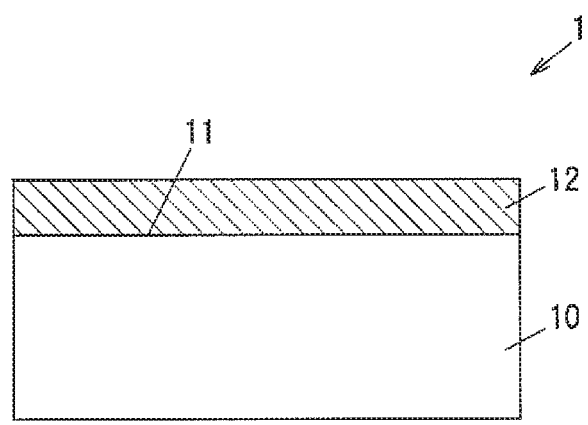
FIG. 1 is a vertical cross-sectional view showing a crystal laminate structure in an embodiment.

FIG. 1 is a vertical cross-sectional view showing a crystal laminate structure 1 in an embodiment. The crystal laminate structure 1 has a $Ga_2O_3$-based substrate 10 and a β-$Ga_2O_3$-based single crystal film 12 formed on a principal surface 11 of the $Ga_2O_3$-based substrate 10 by epitaxial crystal growth.

The $Ga_2O_3$-based substrate 10 is a substrate formed of a $Ga_2O_3$-based single crystal with a β-crystal structure. The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ ($0<x≤1$, $0≤y≤1$, $0<x+y≤1$) single crystal which is a $Ga_2O_3$ single crystal doped with Al and In. The band gap is widened by adding Al and is narrowed by adding In. The $Ga_2O_3$-based substrate 10 may also contain a conductive impurity such as Si.

The plane orientation of the principal surface 11 of the $Ga_2O_3$-based substrate 10 is, e.g., (001), (010), (−201) or (101).

To form the $Ga_2O_3$-based substrate 10, for example, a bulk crystal of a $Ga_2O_3$-based single crystal grown by, e.g., a melt-growth technique such as the FZ (Floating Zone) method or the EFG (Edge Defined Film Fed Growth) method is sliced and the surface thereof is then polished.

The β-$Ga_2O_3$-based single crystal film 12 is formed of a $Ga_2O_3$-based single crystal with a β-crystal structure in the same manner as the $Ga_2O_3$-based substrate 10. The β-$Ga_2O_3$-based single crystal film 12 also contains a dopant such as Li, Na, K, Rb, Cs, Be, Mg, Ca, Sr, Ba, Sc, Y, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Hg, B, Al, In, Tl, C, Si, Ge, Sn, Pb, N, P, As, Sb, Bi, S, Se or Te, etc., which is doped during crystal growth.

A concentration of the dopant contained in the β-$Ga_2O_3$-based single crystal film 12 is not less than $1×10^{13}$ atoms/$cm^3$ and not more than $5×10^{20}$ atoms/$cm^3$, preferably, not less than $6.5×10^{15}$ atoms/$cm^3$ and not more than $2.1×10^{20}$ atoms/$cm^3$.

A density of carrier generated by the doping of the dopant is, e.g., not less than $3.2×10^{15}$ $cm^{-3}$ and not more than $1.8×10^{18}$ $cm^{-3}$.

The β-$Ga_2O_3$-based single crystal film 12 also contains Cl at a concentration of not more than $5×10^{16}$ atoms/$cm^3$. This results from that the β-$Ga_2O_3$-based single crystal film 12 is formed by the HVPE method using Cl-containing gas. Generally, Cl-containing gas is not used to form a β-$Ga_2O_3$-based single crystal film when using a method other than the HVPE method, and the β-$Ga_2O_3$-based single crystal film does not contain Cl, or at least does not contain $1×10^{16}$ $cm^{-3}$ or more of Cl.

Meanwhile, the β-$Ga_2O_3$-based single crystal film 12 is formed by the HYPE (Halide Vapor Phase Epitaxy) method with a high crystal growth rate, and thus can be formed thick, e.g., can have a thickness of not less than 1000 nm. In general, a growth rate of the β-$Ga_2O_3$-based single crystal film by industrial HVPE is 200 μm/h, and in this case, a film of up to 1000 μm in thickness can be grown in a realistic production time. In other words, it is possible to form the β-$Ga_2O_3$-based single crystal film 12 having a thickness of not less than 1000 nm and not more than 1000 μm. In this regard, use of the MBE method is not realistic in actual production since a crystal growth rate of the β-$Ga_2O_3$-based single crystal film is about 120 nm/h and it requires not less than 8 hours to form a film of not less than 1000 nm in thickness.

Additionally, a buffer layer may be provided between the $Ga_2O_3$-based substrate 10 and the β-$Ga_2O_3$-based single crystal film 12 to prevent carrier compensation in the β-$Ga_2O_3$-based single crystal film 12 due to impurity diffusion from the $Ga_2O_3$-based substrate 10.

(Structure of Vapor Phase Deposition System)

A structure of a vapor phase deposition system used for growing the β-$Ga_2O_3$-based single crystal film 12 in the present embodiment will be described below as an example.

Figure 2:
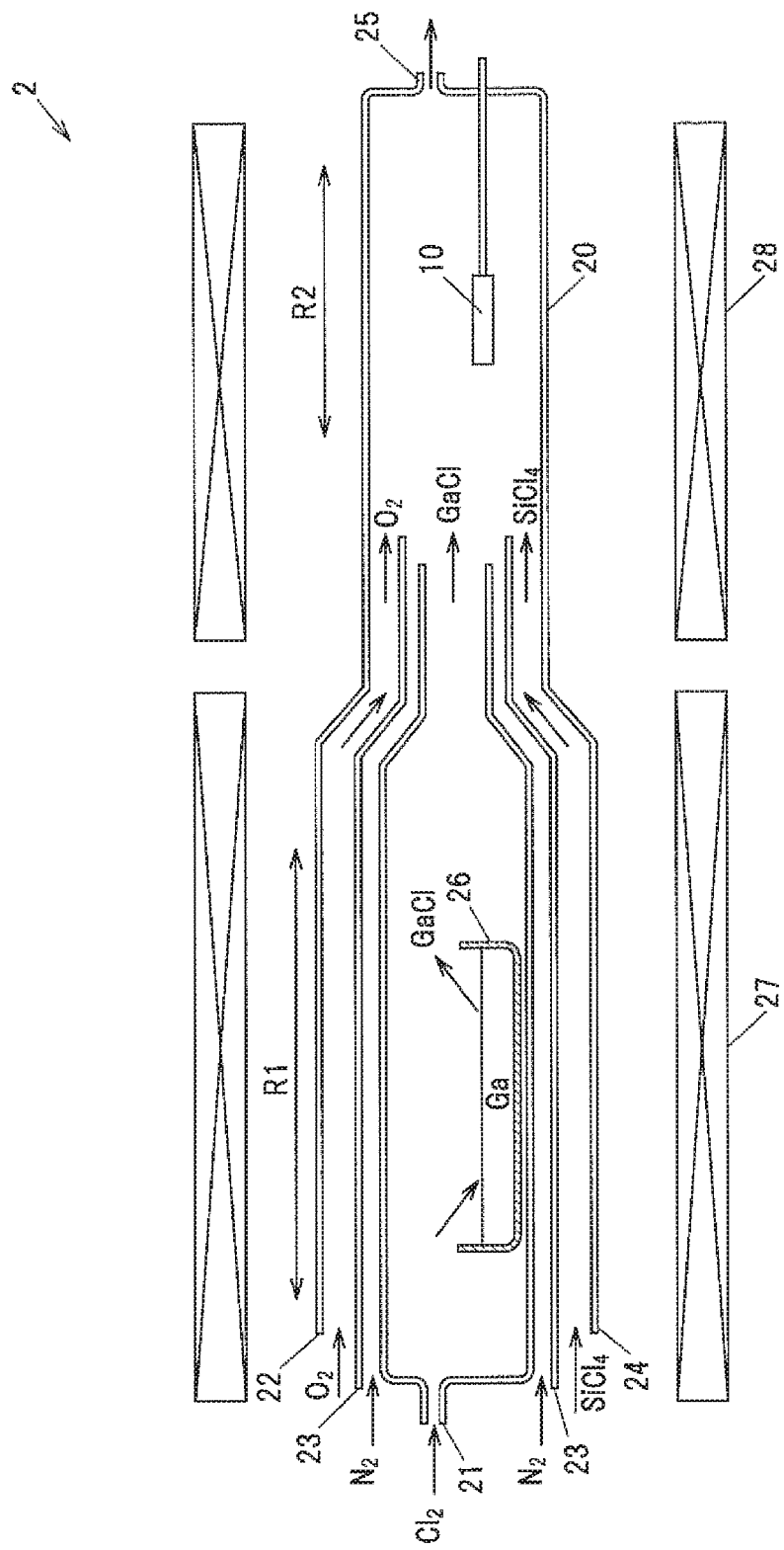
FIG. 2 is a vertical cross-sectional view showing a vapor phase deposition system in the embodiment.

FIG. 2 is a vertical cross-sectional view showing a vapor phase deposition system 2 in the embodiment. The vapor phase deposition system 2 is a vapor phase deposition system using the HVPE method, and has a reaction chamber 20 having a first gas introducing port 21, a second gas introducing port 22, a third gas introducing port 23, a fourth gas introducing port 24 and an exhaust port 25, and a first heating means 27 and a second heating means 28 which are placed to surround the reaction chamber 20 to heat predetermined regions in the reaction chamber 20.

The growth rate when using the HVPE method is higher than that in the MBE method, etc. In addition, in-plane distribution of film thickness is highly uniform and it is possible to grow a large-diameter film. Therefore, it is suitable for mass production of crystal.

The reaction chamber 20 has a source reaction region R1 in which a reaction container 26 containing a Ga source is placed and a gallium source gas is produced, and a crystal growth region R2 in which the $Ga_2O_3$-based substrate 10 is placed and the β-$Ga_2O_3$-based single crystal film 12 is grown thereon. The reaction chamber 20 is formed of, e.g., quartz glass.

Here, the reaction container 26 is formed of, e.g., quartz glass and the Ga source contained in the reaction container 26 is metal gallium.

The first heating means 27 and the second heating means 28 are capable of respectively heating the source reaction region R1 and the crystal growth region R2 of the reaction chamber 20. The first heating means 27 and the second heating means 28 are, e.g., resistive heaters or radiation heaters.

The first gas introducing port 21 is a port for introducing a Cl-containing gas ($Cl_2$ gas or HCl gas) into the source reaction region R1 of the reaction chamber 20 using an inert carrier gas ($N_2$ gas, Ar gas or He gas). The second gas introducing port 22 is a port for introducing an oxygen-containing gas ($O_2$ gas or $H_2O$ gas, etc.) as an oxygen source gas into the crystal growth region R2 of the reaction chamber 20 using an inert carrier gas ($N_2$ gas, Ar gas or He gas). The third gas introducing port 23 is a port for introducing an inert carrier gas ($N_2$ gas, Ar gas or He gas) into the crystal growth region R2 of the reaction chamber 20. The fourth gas introducing port 24 is a port for introducing a source gas of dopant to be added to the β-$Ga_2O_3$-based single crystal film 12, such as Si (e.g., silicon tetrachloride, etc.), into the crystal growth region R2 of the reaction chamber 20 using an inert carrier gas ($N_2$ gas, Ar gas or He gas).

(Growth of β-$Ga_2O_3$-Based Single Crystal Film)

To grow the β-$Ga_2O_3$-based single crystal film 12, it is possible to use a technique of growing β-$Ga_2O_3$-based single crystal film disclosed in Japanese Patent Application No. 2014-088589. A process of growing the β-$Ga_2O_3$-based single crystal film 12 in the present embodiment will be described below as an example.

Firstly, the source reaction region R1 of the reaction chamber 20 is heated by the first heating means 27 and an atmosphere temperature in the source reaction region R1 is then maintained at a predetermined temperature.

Next, in the source reaction region R1, a Cl-containing gas introduced through the first gas introducing port 21 using a carrier gas is reacted with the metal gallium in the reaction container 26 at the above-mentioned atmosphere temperature, thereby producing a gallium chloride gas.

The atmosphere temperature in the source reaction region R1 here is preferably a temperature at which GaCl gas has the highest partial pressure among component gases of the gallium chloride gas produced by the reaction of the metal gallium in the reaction container 26 with the Cl-containing gas. The gallium chloride gas here contains GaCl gas, $GaCl_2$ gas, $GaCl_3$ gas and $(GaCl_3)_2$ gas, etc.

The temperature at which a driving force for growth of $Ga_2O_3$ crystal is maintained is the highest with the GaCl gas among the gases contained in the gallium chloride gas. Growth at a high temperature is effective to obtain a high-quality $Ga_2O_3$ crystal with high purity. Therefore, for growing the $\beta$-$Ga_2O_3$-based single crystal film 12, it is preferable to produce a gallium chloride gas in which a partial pressure of GaCl gas having a high driving force for growth at a high temperature is high.

It is possible to increase a partial pressure ratio of the GaCl gas in the gallium chloride gas by reacting the metal gallium with the Cl-containing gas at an atmosphere temperature of about not less than 300° C. Therefore, it is preferable that the metal gallium in the reaction container 26 be reacted with the Cl-containing gas in a state that the atmosphere temperature in the source reaction region R1 is maintained at not less than 300° C. by using the first heating means 27.

At the atmosphere temperature of, e.g., 850° C., the partial pressure ratio of the GaCl gas is predominantly high (the equilibrium partial pressure of the GaCl gas is four orders of magnitude greater than the $GaCl_2$ gas and is eight orders of magnitude greater than the $GaCl_3$ gas) and the gases other than GaCl gas hardly contribute to the growth of $Ga_2O_3$ crystal.

Meanwhile, considering the lifetime of the first heating means 27 and heat resistance of the reaction chamber 20 formed of quartz glass, etc., it is preferable that the metal gallium in the reaction container 26 be reacted with the Cl-containing gas in a state that the atmosphere temperature in the source reaction region R1 is maintained at not more than 1000° C.

In addition, if hydrogen is contained in an atmosphere for growing the $\beta$-$Ga_2O_3$-based single crystal film 12, surface flatness and a driving force for growth of the $\beta$-$Ga_2O_3$-based single crystal film 12 decrease. Therefore, it is preferable that a $Cl_2$ gas not containing hydrogen be used as the Cl-containing gas.

Next, in the crystal growth region R2, the gallium chloride gas produced in the source reaction region R1 is mixed with the oxygen-containing gas introduced through the second gas introducing port 22 and the dopant source gas such as Si introduced through the fourth gas introducing port 24, the $Ga_2O_3$-based substrate 10 is then exposed to the mixed gas, and the $\beta$-$Ga_2O_3$-based single crystal film 12 containing the dopant is thereby epitaxially grown on the $Ga_2O_3$-based substrate 10. At this time, in a furnace housing the reaction chamber 20, pressure in the crystal growth region R2 is maintained at, e.g., 1 atm.

The dopant source gas used here is preferably a chloride-based gas to prevent other unintentional impurities from being mixed. For example, when Si, Ge, Sn or Pb (Group 14 element) is selected from the dopants listed above and is used as a dopant, a chloride-based gas such as $SiCl_4$, $GeCl_4$, $SnCl_4$ or $PbCl_2$, respectively, is used. Here, the chloride-based gas is not limited to a compound of an element with only chlorine, and may be, e.g., a silane-based gas such as $SiHCl_3$.

The dopant such as Si is doped during growth of a $\beta$-$Ga_2O_3$-based single crystal.

If hydrogen is contained in an atmosphere for growing the $\beta$-$Ga_2O_3$-based single crystal film 12, surface flatness and a driving force for growth of the $\beta$-$Ga_2O_3$-based single crystal film 12 decrease. Therefore, it is preferable that an $O_2$ gas not containing hydrogen be used as the oxygen-containing gas.

Meanwhile, the smaller the equilibrium partial pressure of the GaCl gas, the more the GaCl gas is consumed for growth of $Ga_2O_3$ crystal and the $Ga_2O_3$ crystal grows efficiently. For example, the equilibrium partial pressure of the GaCl gas sharply falls when a ratio of the supplied partial pressure of the $O_2$ gas to the supplied partial pressure of the GaCl gas (the $O_2$/GaCl supplied partial pressure ratio) is not less than 0.5. Therefore, to efficiently grow the $\beta$-$Ga_2O_3$-based single crystal film 12, the $\beta$-$Ga_2O_3$-based single crystal film 12 is preferably grown in a state that the $O_2$/GaCl supplied partial pressure ratio in the crystal growth region R2 is not less than 0.5.

Figure 3:
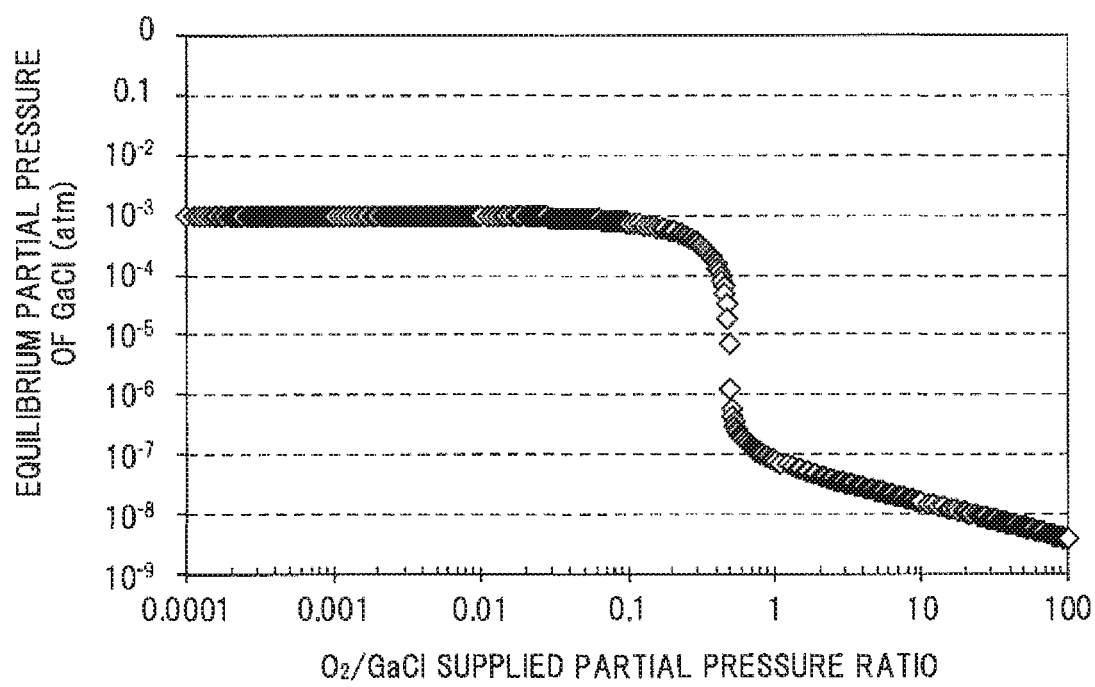
FIG. 3 is a graph which is obtained by thermal equilibrium calculation and shows a relation between equilibrium partial pressure of GaCl and an O$_2$/GaCl supplied partial pressure ratio when the atmosphere temperature during Ga$_2$O$_3$ crystal growth is 1000° C.

FIG. 3 is a graph which is obtained by thermal equilibrium calculation and shows a relation between an equilibrium partial pressure of GaCl and an $O_2$/GaCl supplied partial pressure ratio when the atmosphere temperature during $Ga_2O_3$ crystal growth is 1000° C. It is calculated using the supplied partial pressure value of the GaCl gas fixed to $1 \times 10^{-3}$ atm, a furnace pressure of 1 atom adjusted by using, e.g., an inert gas such as $N_2$ as a carrier gas, and various values of the $O_2$ gas supplied partial pressure.

In FIG. 3, the horizontal axis indicates the $O_2$/GaCl supplied partial pressure ratio and the vertical axis indicates an equilibrium partial pressure (atm) of GaCl gas. It is shown that the smaller the equilibrium partial pressure of the GaCl gas, the more the GaCl gas is consumed for growth of $Ga_2O_3$ crystal, i.e., the $Ga_2O_3$ crystal grows efficiently.

FIG. 3 shows that the equilibrium partial pressure of the GaCl gas sharply falls at the $O_2$/GaCl supplied partial pressure ratio of not less than 0.5.

Meanwhile, a growth temperature of not less than 900° C. is required to grow the $\beta$-$Ga_2O_3$-based single crystal film 12. A single crystal may not be obtained at less than 900° C.

(Evaluation of $\beta$-$Ga_2O_3$-Based Single Crystal Film)

Plural $\beta$-$Ga_2O_3$-based single crystal films 12 were formed under different growth conditions, and Si concentration and carrier density thereof were measured. The results are shown in Tables 1 to 3 below.

Samples a1 and a2 shown in Table 1 are the crystal laminate structures 1 each having the $\beta$-$Ga_2O_3$-based single crystal film 12 formed under the condition that a partial pressure of the GaCl gas supplied as a Ga source gas, $P^0{}_{GaCl}$, was fixed to $2 \times 10^{-4}$ atm. Meanwhile, samples b1 to b12 shown in Table 2 are the crystal laminate structures 1 each having the $\beta$-$Ga_2O_3$-based single crystal film 12 formed under the condition that $P^0{}_{GaCl}$ was fixed to $5 \times 10^{-4}$ atm, and samples c1 to c9 shown in Table 3 are the crystal laminate structures 1 each having the $\beta$-$Ga_2O_3$-based single crystal film 12 formed under the condition that $P^0{}_{GaCl}$ was fixed to $1 \times 10^{-3}$ atm.

In the samples a1, a2, b1 to b12 and c1 to c9, a 7 μm-thick Si-containing β-Ga$_2$O$_3$ single crystal film was formed as the β-Ga$_2$O$_3$-based single crystal film 12 on a β-Ga$_2$O$_3$ substrate having a (001)-oriented principal surface used as the Ga$_2$O$_3$-based substrate 10.

"$R_{Si}$" in Tables 1 to 3 is a physical quantity expressed by $P^0{}_{SiCl4}/(P^0{}_{GaCl}+P^0{}_{SiCl4})$. $P^0{}_{SiCl4}$ here is a partial pressure of the SiCl$_4$ gas supplied as a Si source gas during growth of the β-Ga$_2$O$_3$-based single crystal film 12. The value of $P^0{}_{GaCl}$ for forming the β-Ga$_2$O$_3$-based single crystal film 12 is not specifically limited as long as pressure in the crystal growth region R2 of the vapor phase deposition system 2 (e.g., 1 atm) is maintained.

"Si concentration" in Tables 1 to 3 is a concentration of Si as a dopant in the β-Ga$_2$O$_3$-based single crystal film 12 (in a region at a depth of 2 to 6 μm from the surface) obtained by SIMS (Secondary Ion Mass Spectrometry). The background level of the Si concentration measured by SIMS differs depending on the measurement conditions. The Si concentration of the samples b2 and b3 was measured under the condition that the background level was about $3.0\times10^{15}$ atoms/cm$^3$, the Si concentration of the other samples was measured under the condition that the background level was about $3.0\times10^{16}$ atoms/cm$^3$, and Si at a concentration of not more than the background level is not detectable in each sample.

"$N_d$–$N_a$" in Tables 1 to 3 is a difference between a donor concentration $N_d$ and an acceptor concentration $N_a$, i.e., a carrier concentration, obtained by ECV (Electrochemical Capacitance-Voltage) measurement.

TABLE 1

| Sample number | $R_{Si}$ | Si concentration [atoms/cm$^3$] | $N_d - N_a$ [cm$^{-3}$] |
|---|---|---|---|
| a1 | $6.3 \times 10^{-6}$ | $7.1 \times 10^{17}$ | — |
| a2 | $3.1 \times 10^{-5}$ | $2.1 \times 10^{18}$ | — |

TABLE 2

| Sample number | $R_{Si}$ | Si concentration [atoms/cm$^3$] | $N_d - N_a$ [cm$^{-3}$] |
|---|---|---|---|
| b1 | $2.5 \times 10^{-8}$ | — | $7.4 \times 10^{15}$ |
| b2 | $2.5 \times 10^{-8}$ | $6.5 \times 10^{15}$ | — |
| b3 | $5.0 \times 10^{-8}$ | $1.0 \times 10^{16}$ | — |
| b4 | $2.5 \times 10^{-7}$ | — | $3.6 \times 10^{16}$ |
| b5 | $2.5 \times 10^{-6}$ | $1.7 \times 10^{17}$ | — |
| b6 | $2.5 \times 10^{-6}$ | $2.2 \times 10^{17}$ | — |
| b7 | $5.0 \times 10^{-6}$ | $3.5 \times 10^{17}$ | $2.8 \times 10^{17}$ |
| b8 | $1.0 \times 10^{-5}$ | $5.7 \times 10^{17}$ | $5.7 \times 10^{17}$ |
| b9 | $1.3 \times 10^{-5}$ | $5.3 \times 10^{17}$ | $5.2 \times 10^{17}$ |
| b10 | $1.3 \times 10^{-5}$ | $5.7 \times 10^{17}$ | — |
| b11 | $6.3 \times 10^{-5}$ | $2.7 \times 10^{18}$ | — |
| b12 | $7.5 \times 10^{-4}$ | $1.4 \times 10^{20}$ | — |

TABLE 3

| Sample number | $R_{Si}$ | Si concentration [atoms/cm$^3$] | $N_d - N_a$ [cm$^{-3}$] |
|---|---|---|---|
| c1 | $1.3 \times 10^{-8}$ | — | $3.4 \times 10^{15}$ |
| c2 | $1.3 \times 10^{-7}$ | — | $2.0 \times 10^{16}$ |
| c3 | $1.3 \times 10^{-6}$ | $8.8 \times 10^{16}$ | — |
| c4 | $2.5 \times 10^{-6}$ | $1.5 \times 10^{17}$ | — |
| c5 | $3.1 \times 10^{-6}$ | $1.2 \times 10^{17}$ | $1.9 \times 10^{17}$ |
| c6 | $6.3 \times 10^{-6}$ | $2.2 \times 10^{17}$ | — |
| c7 | $1.3 \times 10^{-5}$ | $4.0 \times 10^{17}$ | — |
| c8 | $3.1 \times 10^{-5}$ | $1.2 \times 10^{18}$ | $1.8 \times 10^{18}$ |
| c9 | $1.9 \times 10^{-3}$ | $2.1 \times 10^{20}$ | — |

From Tables 2 and 3, it is understood that the carrier density obtained by ECV measurement substantially coincides with the Si concentration obtained by SIMS measurement. From Table 4 which is described later, it is understood that the carrier density obtained by Hall measurement also substantially coincides with the Si concentration obtained by SIMS measurement.

Figure 4:
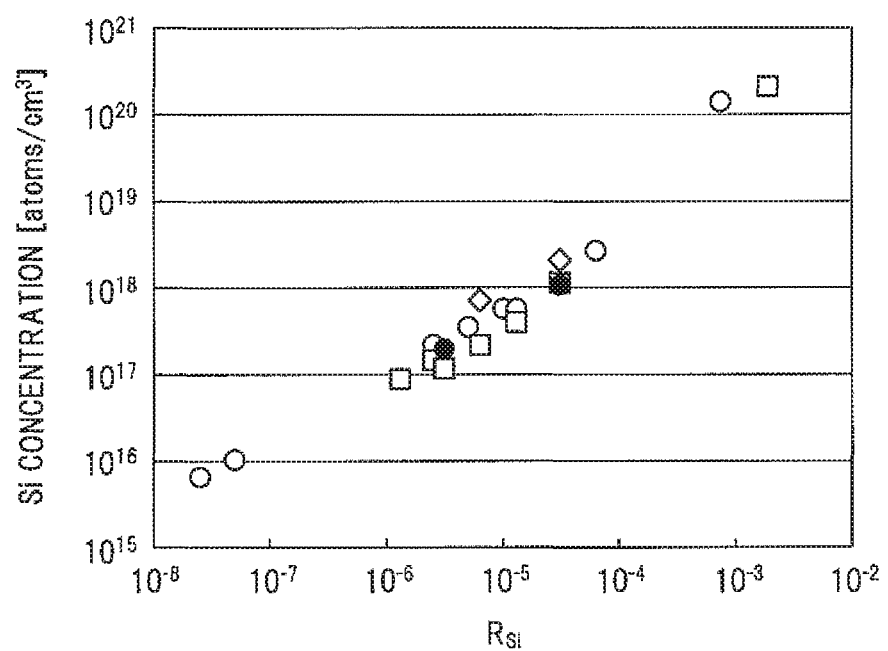
FIG. 4 is a graph showing a relation between R$_{Si}$ and Si concentration of a grown $\beta$-Ga$_2$O$_3$-based single crystal film.

FIG. 4 is a graph which is obtained from the data of Tables 1 to 3 and Table 4 (described later) and shows a relation between $R_{Si}$ and Si concentration of the grown β-Ga$_2$O$_3$-based single crystal film 12.

In FIG. 4, plot symbols "◇" indicate the measured values for the samples a1 and a2 shown in Table 1, "○" indicate the measured values for the samples b5 to b12 shown in Table 2, and "□" indicate the measured values for the samples c3 to c9 shown in Table 3. Plot symbols "●" in FIG. 4 indicate the measured values for the samples d3 and d4 shown in Table 4.

FIG. 4 shows that the relation between $R_{Si}$ and the Si concentration of the β-Ga$_2$O$_3$-based single crystal film 12 is a substantially linear relation and the Si concentration of the β-Ga$_2$O$_3$-based single crystal film 12 can be controlled by adjusting the SiCl$_4$ gas supply amount relative to the GaCl gas supply amount.

Figure 5:
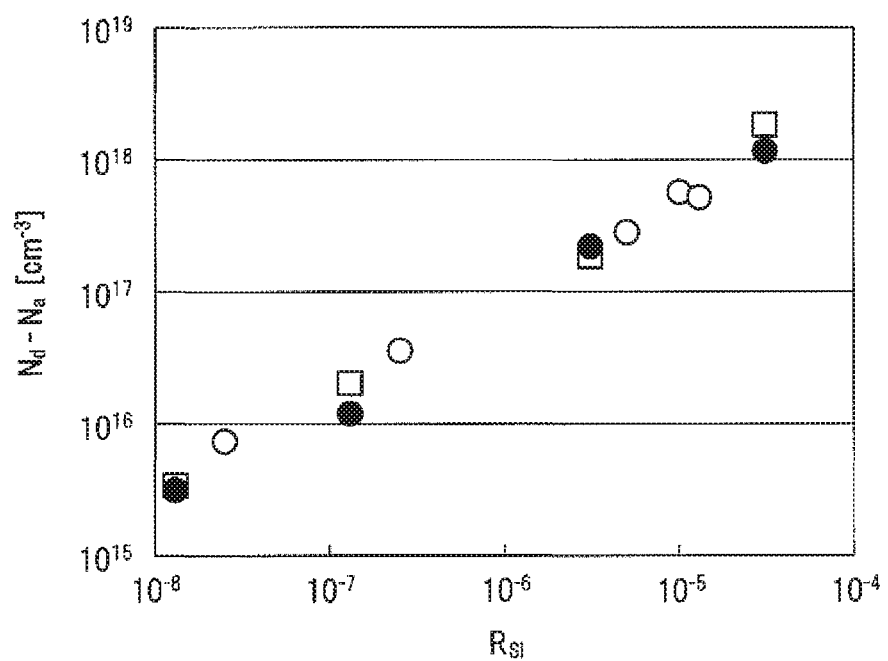
FIG. 5 is a graph showing a relation between R$_{Si}$ and carrier density of the grown $\beta$-Ga$_2$O$_3$-based single crystal film.

FIG. 5 is a graph showing a relation between $R_{Si}$ and carrier density of the grown β-Ga$_2$O$_3$-based single crystal film 12.

In FIG. 5, plot symbols "○" indicate the measured values for the samples b1, b4 and b7 to b9 shown in Table 2, and "□" indicate the measured values for the samples c1, c2, c5 and c8 shown in Table 3. Plot symbols "●" in FIG. 5 indicate the measured values for the samples d1 to d4 shown in Table 4 (described later).

FIG. 5 shows that the relation between $R_{Si}$ and the carrier density of the β-Ga$_2$O$_3$-based single crystal film 12 is a substantially linear relation.

From the actual measurement data shown in FIG. 4, it is understood that it is possible to control the Si concentration at least in the range of not less than $6.5\times10^{15}$ atoms/cm$^3$ and not more than $2.1\times10^{20}$ atoms/cm$^3$. Furthermore, based on the linearity of the actual measurement data shown in FIG. 4, it is considered that the Si concentration can be controlled in a wider range.

However, when trying to dope Si at a concentration of less than about $1\times10^{13}$ atoms/cm$^3$, it is difficult to accurately control the partial pressure of the doping gas and it is thus difficult to control the Si concentration. Meanwhile, the upper limit of the Si concentration at which crystal quality of the β-Ga$_2$O$_3$-based single crystal film 12 can be maintained by solid solubility of Si in β-Ga$_2$O$_3$-based single crystal is about $5.0\times10^{20}$ atoms/cm$^3$. Thus, it is preferable to control the Si concentration in the range of not less than $1\times10^{13}$ atoms/cm$^3$ and not more than $5.0\times10^{20}$ atoms/cm$^3$.

Meanwhile, from the actual measurement data shown in FIG. 5, it is understood that it is possible to control the carrier density at least in the range of not less than $3.2\times10^{15}$ cm$^{-3}$ and not more than $1.8\times10^{18}$ cm$^{-3}$ by adding the dopant. Furthermore, based on the linearity of the actual measurement data shown in FIG. 5, it is considered that the carrier density can be controlled in a wider range, in the same manner as the Si concentration.

In an undoped β-$Ga_2O_3$-based single crystal film grown by the HYPE method, carriers with a density of not more than 1×10$^{13}$ cm$^{-3}$ remains as disclosed in Japanese Patent Application No. 2014-088589, and it is difficult to control the carrier concentration to be lower than 1×10$^{13}$ cm$^{-3}$. In addition, the upper limit of the Si concentration at which crystal quality of the β-$Ga_2O_3$-based single crystal film 12 can be maintained is about 5.0×10$^{20}$ atoms/cm$^3$ as described above. Therefore, for the carrier concentration which substantially coincides with the Si concentration, the upper limit at which crystal quality of the β-$Ga_2O_3$-based single crystal film 12 can be maintained is considered to be about 5.0×10$^{20}$ cm$^{-3}$. Thus, it is preferable to control the carrier density of the $Ga_2O_3$-based single crystal film in the range of not less than 1×10$^{13}$ cm$^{-3}$ and not more than 5.0×10$^{20}$ cm$^{-3}$.

Figure 6:
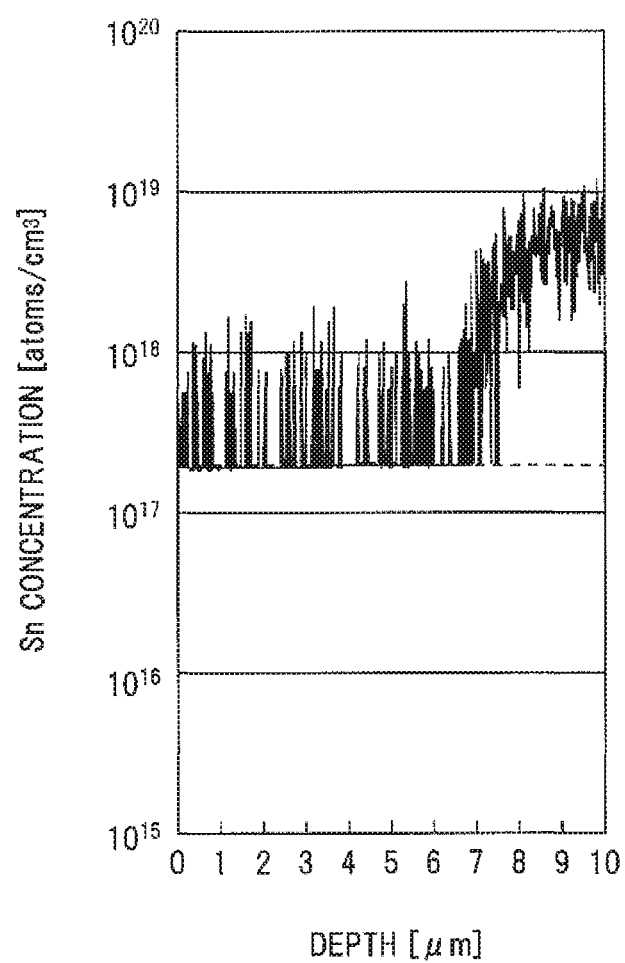
FIG. 6 is a SIMS profile of Sn in a sample c4 shown in Table 3.

FIG. 6 is a SIMS profile of Sn in the sample c4 shown in Table 3. In FIG. 6, the horizontal axis indicates a depth from the surface of the crystal laminate structure 1 (from the surface of the β-$Ga_2O_3$-based single crystal film 12), and the vertical axis indicates Sn concentration. In addition, a dotted line in FIG. 6 indicates the background level (2.0×10$^{17}$ atoms/cm$^3$) of the Sn concentration.

Sn is a dopant contained in the $Ga_2O_3$-based substrate 10 of the sample c4. From the SIMS profile of Sn in FIG. 6, it is understood that an interface between the $Ga_2O_3$-based substrate 10 and the β-$Ga_2O_3$-based single crystal film 12 is located at a depth about of 7 μm from the surface of the crystal laminate structure 1. Since the β-$Ga_2O_3$-based single crystal films 12 of all samples shown in Table 1 to 3 were formed under the same growth conditions, an interface between the $Ga_2O_3$-based substrate 10 and the β-$Ga_2O_3$-based single crystal film 12 in each sample is located at a depth of about 7 μm from the surface of the crystal laminate structure 1.

FIGS. 7A to 7D are SIMS profiles of Si in the samples c3, c4, c6 and c7 shown in Table 3. In FIGS. 7A to 7D, the horizontal axis indicates a depth from the surface of the crystal laminate structure 1, and the vertical axis indicates Si concentration. In addition, in FIGS. 7A to 7D, a horizontal dotted line indicates the background level of the Si concentration (3.0×10$^{16}$ atoms/cm$^3$) and a vertical dot-and-dash line indicates the position of the interface between the $Ga_2O_3$-based substrate 10 and the β-$Ga_2O_3$-based single crystal film 12 (depth of 7 μm).

FIGS. 8A to 8D are SIMS profiles of Cl in the samples c3, c4, c6 and c7 shown in Table 3. In FIGS. 8A to 8D, the horizontal axis indicates a depth from the surface of the crystal laminate structure 1, and the vertical axis indicates Cl concentration. In addition, in FIGS. 8A to 8D, a horizontal dotted line indicates the background level of the Cl concentration (2.0×10$^{15}$ atoms/cm$^3$) and a vertical dot-and-dash line indicates the position of the interface between the $Ga_2O_3$-based substrate 10 and the β-$Ga_2O_3$-based single crystal film 12 (depth of 7 μm).

According to FIGS. 8A to 8D, the β-$Ga_2O_3$ single crystal film contains Cl at a concentration of not more than about 5×10$^{16}$ atoms/cm$^3$. This results from that the $Ga_2O_3$ single crystal film is formed by the HVPE method using Cl-containing gas. Generally, Cl-containing gas is not used to form a $Ga_2O_3$ single crystal film when using a method other than the HVPE method, and the $Ga_2O_3$ single crystal film does not contain Cl, or at least does not contain 1×10$^{16}$ atoms/cm$^3$ or more of Cl.

Plural β-$Ga_2O_3$ single crystal films were formed under different growth conditions, and carrier density, resistivity and electron mobility thereof were measured. The results are shown in Table 4 below. These values were obtained by Hall measurement using the Van del Pauw method. In the Hall measurement, a DC magnetic field of 0.57 T and an electric current of 0.1 mA were applied at room temperature (25° C.). Table 4 also shows the Si concentration in the β-$Ga_2O_3$-based single crystal film (in a region at a depth of 2 to 6 μm from the surface) measured by SIMS.

The samples d1 to d4 to be subjected to Hall measurement were made as follows. Firstly, a β-$Ga_2O_3$ single crystal film was epitaxially grown on a highly Fe-doped β-$Ga_2O_3$ substrate having a (001)-oriented principal surface. At this time, $SiCl_4$ gas supply was started in the middle of the growth of the β-$Ga_2O_3$ single crystal film so that a 2 μm-thick undoped β-$Ga_2O_3$ single crystal film and an 8 μm-thick Si-doped β-$Ga_2O_3$ single crystal film were formed. The undoped β-$Ga_2O_3$ single crystal film has a function of preventing diffusion of Fe from the β-$Ga_2O_3$ substrate and thus preventing carrier compensation in the Si-doped β-$Ga_2O_3$ single crystal film.

The β-$Ga_2O_3$ single crystal film here was formed under the condition that $P^0_{GaCl}$ was fixed to 1×10$^{-3}$ atm.

Next, for surface flattening, the surface of the Si-doped β-$Ga_2O_3$ single crystal film was polished 2 μm by CMP (Chemical Mechanical Polishing). Next, circular In electrodes having a diameter of 1 mm were formed at four corners on the surface of the Si-doped β-$Ga_2O_3$ single crystal film and were then annealed in a $N_2$ atmosphere at 900° C. for 90 seconds, thereby forming ohmic electrodes.

In the samples d1 to d4 to be subjected to Hall measurement, the β-$Ga_2O_3$ substrate corresponds to the $Ga_2O_3$-based substrate 10 and the Si-doped β-$Ga_2O_3$ single crystal film corresponds to the β-$Ga_2O_3$-based single crystal film 12.

TABLE 4

| Sample number | $R_{Si}$ | $N_d - N_a$ [cm$^{-3}$] | Resistivity [Ω · cm] | Mobility [cm$^2$/V · s] | Si concentration [atoms/cm$^3$] |
|---|---|---|---|---|---|
| d1 | 1.3 × 10$^{-8}$ | 3.2 × 10$^{15}$ | 12.5 | 1.60 × 10$^2$ | — |
| d2 | 1.3 × 10$^{-7}$ | 1.2 × 10$^{16}$ | 3.44 | 1.55 × 10$^2$ | — |
| d3 | 3.1 × 10$^{-6}$ | 2.2 × 10$^{17}$ | 2.47 × 10$^{-1}$ | 1.14 × 10$^2$ | 2.0 × 10$^{17}$ |
| d4 | 3.1 × 10$^{-5}$ | 1.2 × 10$^{18}$ | 5.96 × 10$^{-2}$ | 8.98 × 10 | 1.1 × 10$^{18}$ |

Figure 9:
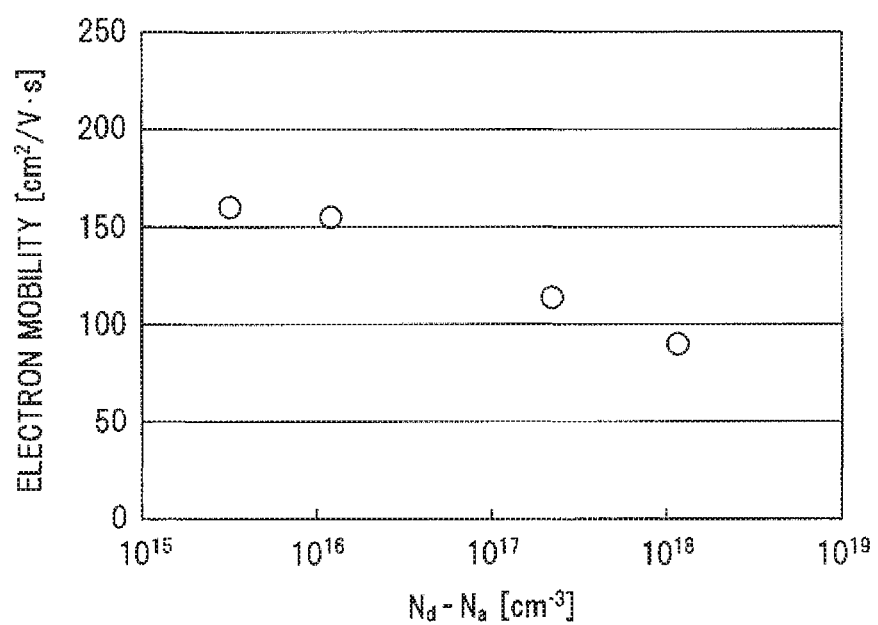
FIG. 9 is a graph showing a relation between carrier density and electron mobility in the β-$Ga_2O_3$-based single crystal film.

FIG. 9 is a graph which is obtained from the data of Table 4 and shows a relation between carrier density ($N_d-N_a$) and electron mobility in the β-$Ga_2O_3$-based single crystal film 12.

FIG. 9 shows that electron mobility increases with a decrease in the carrier density of the β-$Ga_2O_3$-based single crystal film 12.

Although the β-$Ga_2O_3$ substrate having a (001)-oriented principal surface was used as the $Ga_2O_3$-based substrate 10 in the samples a1, a2, b1 to b12, c1 to c9 and d1 to d4 as described above, similar evaluation results are obtained also when a β-$Ga_2O_3$ substrate having a (−201)-, (101)- or (010)-oriented, principal surface is used. In addition, similar evaluation results are obtained also when another β-$Ga_2O_3$-based substrate is used instead of the β-$Ga_2O_3$ substrate or when another β-$Ga_2O_3$-based single crystal film is formed instead of the β-$Ga_2O_3$ single crystal film.

Effects of the Embodiment

In the embodiment, by adding a dopant while growing a β-$Ga_2O_3$-based single crystal using the HVPE method, it is possible to control the dopant concentration of the β-Ga$_2$O$_3$-based single crystal in a wider range than when using the MBE method or the EFG method. In addition, unlike when using ion implantation, problems such as limitation of dopant implantation depth or deterioration of crystallinity due to ion beam do not occur.

Although the embodiment of the invention has been described, the invention is not intended to be limited to the embodiment, and the various kinds of modifications can be implemented without departing from the gist of the invention.

In addition, the invention according to claims is not to be limited to the embodiment described above. Further, it should be noted that all combinations of the features described in the embodiment are not necessary to solve the problem of the invention.

INDUSTRIAL APPLICABILITY

Provided is a crystal laminate structure having a β-Ga$_2$O$_3$-based single crystal film in which a dopant is included throughout the crystal and the concentration of the dopant can be set across a broad range.

REFERENCE SIGNS LIST

1 CRYSTAL LAMINATE STRUCTURE
10 Ga$_2$O$_3$-BASED SUBSTRATE
11 PRINCIPAL SURFACE
12 β-Ga$_2$O$_3$-BASED SINGLE CRYSTAL FILM

The invention claimed is:

1. A crystal laminate structure, comprising:
   a Ga$_2$O$_3$-based substrate; and
   a β-Ga$_2$O$_3$-based single crystal epitaxial film formed by HVPE method on a principal surface of the Ga$_2$O$_3$-based substrate,
   wherein the β-Ga$_2$O$_3$-based single crystal epitaxial film comprises Cl as an unintentional impurity resulting from the HVPE method using Cl-containing gas,
   wherein the β-Ga$_2$O$_3$-based single crystal epitaxial film comprises Si as a dopant doped in parallel with the crystal epitaxial growth at a concentration of not less than $1\times10^{13}$ atoms/cm$^3$ and not more than $5.0\times10^{20}$ atoms/cm$^3$, and
   wherein the concentration of the Si is based on a value of $P^0_{SiCl4}/(P^0_{GaCl}+P^0_{SiCl4})$, when $P^0_{SiCl4}$ and $P^0_{GaCl}$ are a supplied partial pressure of SiCl$_4$ gas that is a source gas of Si and a supplied partial pressure of GaCl gas that is a source gas of Ga, respectively.

2. The crystal laminate structure according to claim 1, wherein a concentration of Cl of the β-Ga$_2$O$_3$-based single crystal epitaxial film is not more than $5\times10^{16}$ atoms/cm$^3$.

3. The crystal laminate structure according to claim 1, wherein the concentration of the Si is not less than $6.5\times10^{15}$ atoms/cm$^3$ and not more than $2.1\times10^{20}$ atoms/cm$^3$.

4. The crystal laminate structure according to claim 1, wherein a density of a carrier generated by the Si is not less than $1\times10^{13}$ cm$^{-3}$ and not more than $5.0\times10^{20}$ cm$^{-3}$.

5. The crystal laminate structure according to claim 4, wherein the density of the carrier generated by the Si is not less than $3.2\times10^{15}$ cm$^{-3}$ and not more than $1.8\times10^{18}$ cm$^{-3}$.

6. The crystal laminate structure according to claim 1, wherein the β-Ga$_2$O$_3$-based single crystal epitaxial film comprises a β-Ga$_2$O$_3$ single crystal epitaxial film.

7. The crystal laminate structure according to claim 1, wherein the principal surface of the Ga$_2$O$_3$-based substrate has a plane orientation of (001), (010), (−201) or (101).

8. The crystal laminate structure according to claim 1, wherein a thickness of the β-Ga$_2$O$_3$-based single crystal epitaxial film is not less than 1000 nm.

9. The crystal laminate structure according to claim 2, wherein the concentration of the Si is not less than $6.5\times10^{15}$ atoms/cm$^3$ and not more than $2.1\times10^{20}$ atoms/cm$^3$.

10. The crystal laminate structure according to claim 2, wherein a density of a carrier generated by the Si is not less than $1\times10^{13}$ cm$^{-3}$ and not more than $5.0\times10^{20}$ cm$^3$.

11. The crystal laminate structure according to claim 10, wherein the density of the carrier generated by the Si is not less than $3.2\times10^{15}$ cm$^3$ and not more than $1.8\times10^{18}$ cm$^3$.

12. The crystal laminate structure according to claim 2, wherein the β-Ga$_2$O$_3$-based single crystal epitaxial film comprises a β-Ga$_2$O$_3$ single crystal film.

13. The crystal laminate structure according to claim 2, wherein the principal surface of the Ga$_2$O$_3$-based substrate has a plane orientation of (001), (010), (−201) or (101).

14. The crystal laminate structure according to claim 2, wherein a thickness of the β-Ga$_2$O$_3$-based single crystal epitaxial film is not less than 1000 nm.

* * * * *